United States Patent
Lee et al.

(10) Patent No.: US 10,249,692 B2
(45) Date of Patent: Apr. 2, 2019

(54) DISPLAY DEVICE AND METHOD OF MANUFACTURING THE SAME

(71) Applicant: Samsung Display Co., Ltd., Yongin-si (KR)

(72) Inventors: Min Jung Lee, Yongin-si (KR); Do Hyun Kwon, Yongin-si (KR); Mi Jang, Yongin-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 15/622,029

(22) Filed: Jun. 13, 2017

(65) Prior Publication Data

US 2018/0026079 A1 Jan. 25, 2018

(30) Foreign Application Priority Data

Jul. 25, 2016 (KR) ........................ 10-2016-0094337

(51) Int. Cl.
*H01L 27/32* (2006.01)

(52) U.S. Cl.
CPC .......... *H01L 27/323* (2013.01); *H01L 27/322* (2013.01); *H01L 27/3246* (2013.01); *H01L 27/3272* (2013.01); *H01L 2227/323* (2013.01)

(58) Field of Classification Search
CPC ............... H01L 27/323; H01L 27/3272; H01L 27/3246; H01L 27/322; H01L 2227/323
See application file for complete search history.

(56) References Cited

U.S. PATENT DOCUMENTS

| | | | |
|---|---|---|---|
| 8,604,465 B2 | 12/2013 | Song et al. | |
| 9,095,017 B2 | 7/2015 | Yi et al. | |
| 9,316,857 B2 | 4/2016 | Yamazaki et al. | |
| 2015/0049030 A1 | 2/2015 | Her | |
| 2016/0043336 A1 | 2/2016 | Kim et al. | |

FOREIGN PATENT DOCUMENTS

| | | |
|---|---|---|
| KR | 10-2012-0014786 | 2/2012 |
| KR | 10-2014-0020748 | 2/2014 |
| KR | 10-2014-0025251 | 3/2014 |
| KR | 10-2015-0020929 | 2/2015 |
| KR | 10-2016-0017396 | 2/2016 |

*Primary Examiner* — David Vu

(74) *Attorney, Agent, or Firm* — H.C. Park & Associates, PLC

(57) ABSTRACT

A display device including a base substrate, a display element disposed on the base substrate, a thin film encapsulation layer covering the display element, a first organic layer disposed on the thin film encapsulation layer, an inorganic layer disposed on the first organic layer, touch electrodes disposed on the inorganic layer, and a second organic layer disposed on the inorganic layer, the second organic layer covering the touch electrodes.

12 Claims, 3 Drawing Sheets

DISPLAY DEVICE AND METHOD OF MANUFACTURING THE SAME

CROSS-REFERENCE TO RELATED APPLICATION

This application claims priority from and the benefit of Korean Patent Application No. 10-2016-0094337, filed on Jul. 25, 2016, which is hereby incorporated by reference for all purposes as if fully set forth herein.

BACKGROUND

Field

Exemplary embodiments relate to a display device and a method of manufacturing the same.

Discussion of the Background

Display devices are used to display image signals. The display devices may include a liquid crystal display device (LCD), a plasma display panel device (PDP), a field emission display device (FED), and organic light emitting device (OLED), an electrophoretic display device (EPD), and the like.

Recently, studies regarding flexible display devices that can maintain display performance even when being bent like paper and which use a flexible material such as plastic, have been actively conducted. A flexible substrate having improved flexibility is used in the flexible display devices, and plastic, resin material, or the like may be used as the material of the flexible substrate.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a display device and a method of manufacturing the same which can prevent separation between a touch sensing part and a thin film encapsulation layer when the display device is curved or bent.

Additional aspects will be set forth in the detailed description which follows, and, in part, will be apparent from the disclosure, or may be learned by practice of the inventive concept.

An exemplary embodiment discloses a display device including: a base substrate; a display element disposed on the base substrate; a thin film encapsulation layer covering the display element; a first organic layer disposed on the thin film encapsulation layer; an inorganic layer disposed on the first organic layer; touch electrodes disposed on the inorganic layer; and a second organic layer disposed on the inorganic layer, the second organic layer covering the touch electrodes.

The display device may further include a color filter disposed on the second organic layer.

The color filter may be disposed to overlap with an organic light emitting layer of the display element.

The second organic layer and the inorganic layer may include a through-hole through which the first organic layer is exposed.

The color filter may be disposed on the first organic layer through the through-hole.

The display device may further include a black matrix disposed on the second organic layer.

The base substrate may have flexibility.

The display element may include: a thin film transistor disposed on the base substrate; an insulating layer disposed on the thin film transistor, the insulating layer including a contact hole through which a portion of a drain electrode of the thin film transistor; and an organic light emitting element disposed on the insulating layer.

The thin film transistor may include: a semiconductor layer disposed on the base substrate; a gate electrode disposed on the semiconductor layer; and source and drain electrodes each connected to the semiconductor layer.

The organic light emitting element may include: a first electrode disposed on the insulating layer; a pixel defining layer disposed on the insulating layer, the pixel defining layer defining pixel regions; an organic light emitting layer disposed on the first electrode; and a second electrode disposed on the organic light emitting layer.

The first organic layer may include multiple layers or a multi-layered structure.

The second organic layer may be disposed to be in contact with the inorganic layer.

An exemplary embodiment also discloses a method of manufacturing a display device, the method including: forming a display element on a base substrate; forming a thin film encapsulation layer covering the display element; forming a first organic layer on the thin film encapsulation layer; forming an inorganic layer on the first organic layer; and forming a touch sensing part on the inorganic layer.

The forming of the touch sensing part may include: forming touch electrodes on the inorganic layer; forming a second organic layer on the inorganic layer to cover the touch electrodes; and forming a color filter on the second organic layer.

The method may further include, before the color filter is formed, forming a through-hole through which the second organic layer and the inorganic layer expose the first organic layer.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
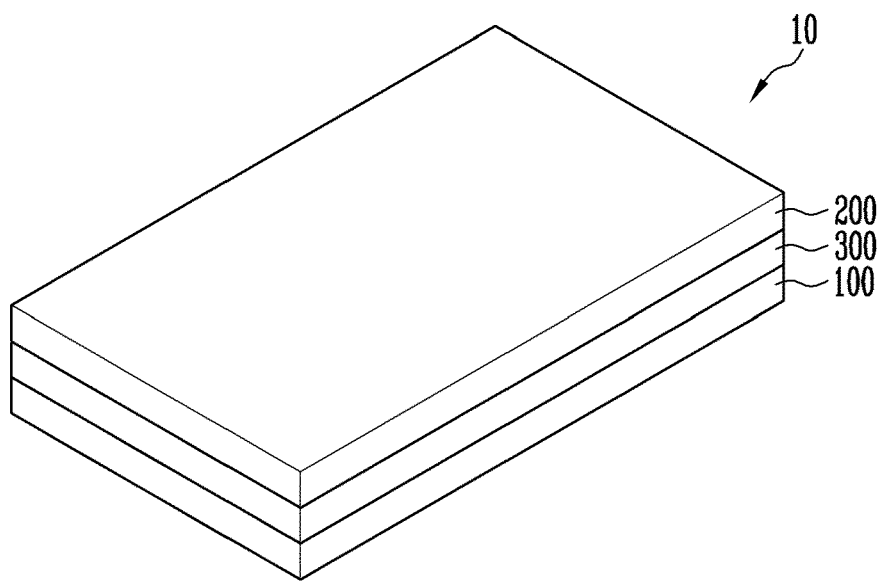
FIG. 1 is a perspective view illustrating a flexible display device according to an exemplary embodiment of the inventive concepts.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
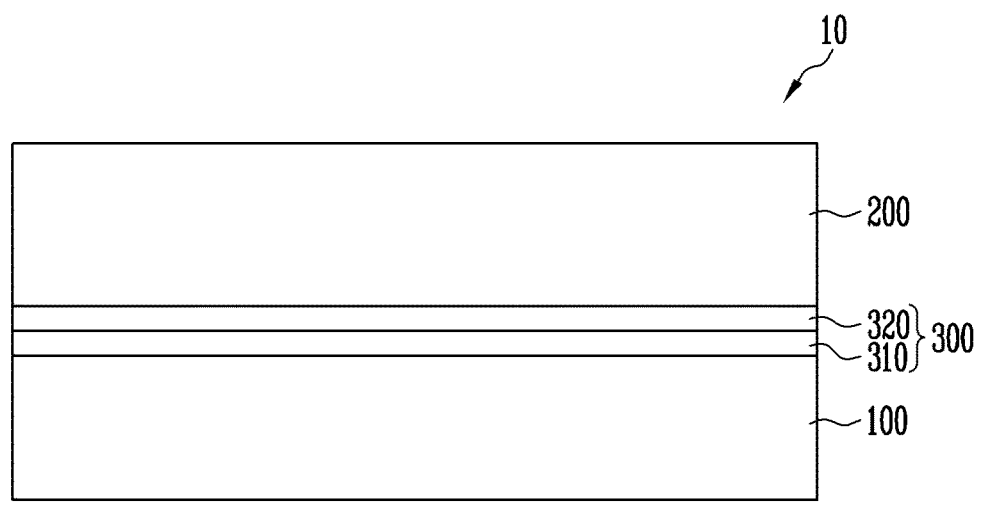
FIG. 2 is a sectional view of the flexible display device shown in FIG. 1.
Figure 3:
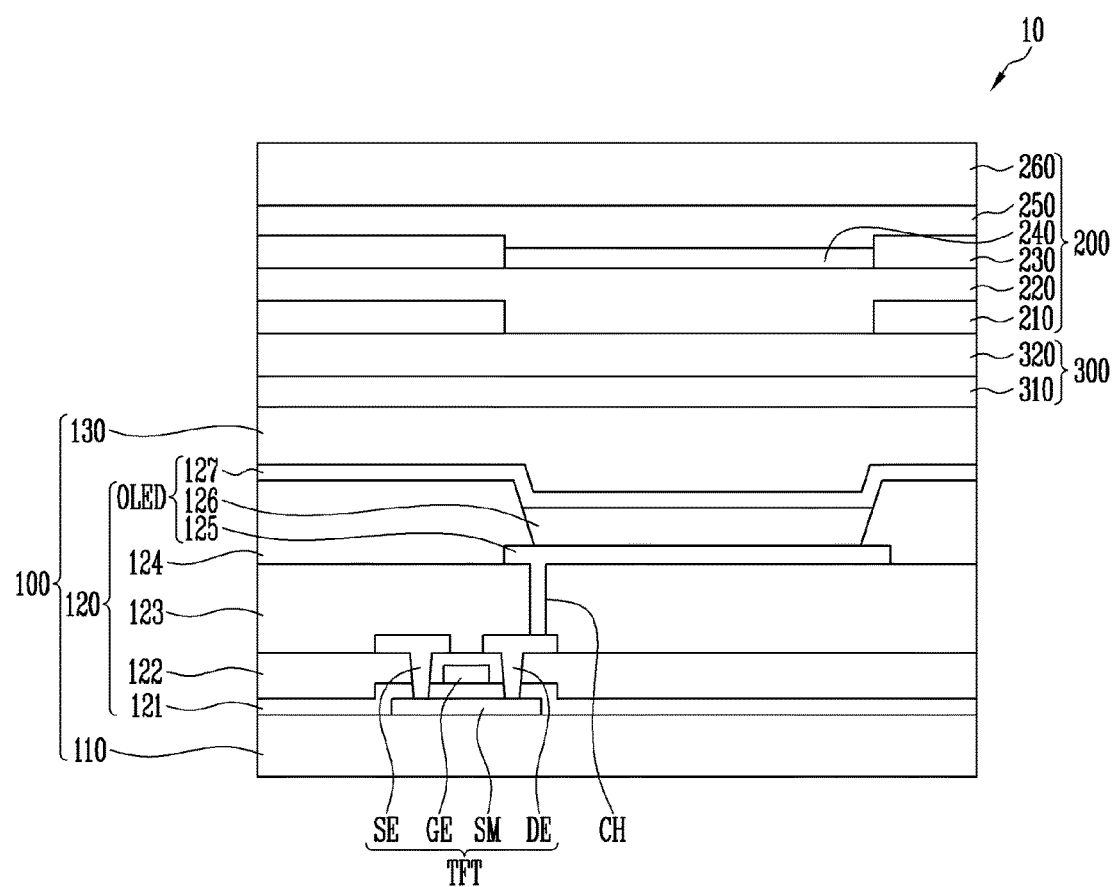
FIG. 3 is a sectional view illustrating a buffer layer, a thin film encapsulation layer, and a touch sensing part, which are shown in FIG. 2.

FIG. 1 is a perspective view illustrating a flexible display device according to an exemplary embodiment of the present disclosure. FIG. 2 is a sectional view of the flexible display device shown in FIG. 1. FIG. 3 is a sectional view illustrating a buffer layer, a thin film encapsulation layer, and a touch sensing part, which are shown in FIG. 2.

Referring to FIG. 1, the display device 10 may be provided in the shape of a rectangular plate having two pairs of sides parallel to each other. When the display device 100 is provided in the shape of the rectangular plate, any one of the two pairs of sides may be provided longer than the other of the two pairs of sides. However, the inventive concepts are not limited thereto, and the display device 10 may be provided in various shapes, such as a circular shape.

The display device 10 may include a display part 100 that displays an image, a touch sensing part 200 that recognizes a touch, and a buffer layer 300 disposed between the display part 100 and the touch sensing part 200.

The display part 100 displays arbitrary visual information, e.g., a text, a video, a picture, a two-dimensional or three-dimensional image, etc. The arbitrary visual information is represented as an "image." The display part 100 is not particularly limited to a kind that displays images.

The touch sensing part 200 may recognize a touch event generated by a user's hand or separate input means. The touch sensing part 200 detects a touch and/or a pressure using sensing electrodes, and the kind of the touch sensing part 200 is not particularly limited.

For example, the touch sensing part 200 may be implemented as a capacitive type, a pressure resistive type, and the like. The capacitive type includes a mutual capacitance type in which a change in capacitance generated by an interaction between two sensing electrodes is sensed, and a self-capacitance type in which a change in capacitance of a sensing electrode itself is sensed.

Referring to FIG. 2, the buffer layer 300 may include a first organic layer 310 disposed on the display part 100 and an inorganic layer 320 disposed on the first organic layer 310.

In the display device 10 according to an exemplary embodiment, the inorganic layer 320 is disposed between the touch sensing part 200 and the first organic layer 310, so as to prevent the touch sensing part 200 from being separated from the buffer layer 300.

Referring to FIG. 3, the display part 100 may include a base substrate 110, a display element 120 disposed on the base substrate 110, and a thin film encapsulation layer 130 that covers the display element 120.

The base substrate 110 may be a flexible substrate. The base substrate 110 may be implemented as any one of film and plastic substrates including a polymer organic material having flexibility.

In some exemplary embodiments, the base substrate 110 may be made of at least one of polyimide (PI), polyethylene terephthalate (PET), polyethylene naphthalate (PEN), polycarbonate (PC), polyarylate (PAR), polyetherimide (PEI), polyethersulfone (PES), polyethylene etherphthalate, and polyacrylate. However, the inventive concepts are not limited thereto, and the base substrate 110 may be formed as a plastic film made of an organic material or may include various materials having flexibility, such as metal foil and thin glass. The base substrate 110 may be a rigid substrate, and may be made of a glass material having silicon oxide ($SiO_2$) as a main component.

The display element 120 may be disposed on the base substrate 110. The display element 120 may include a thin film transistor TFT and an organic light emitting element OLED electrically connected to the thin film transistor TFT.

Specifically, the thin film transistor TFT includes a semiconductor layer SM disposed on the base substrate 110, a gate electrode GE disposed on the semiconductor layer SM, and source and drain electrodes SE and DE disposed on the gate electrode GE.

The semiconductor layer SM is disposed on the base substrate 110, and may include one of amorphous silicon (a-Si), polycrystalline silicon (p-Si), and semiconductor oxide. In addition, the semiconductor layer SM may include a source region formed by doping or injecting impurities into a region in which the semiconductor layer SM is in contact with the source electrode SE, and a drain region formed by doping or injecting impurities into a region in which the semiconductor layer SM is in contact with the drain electrode DE.

A first insulating layer 121 may be disposed over the semiconductor layer SM. The first insulating layer 121 may cover the semiconductor layer SM and insulate the semiconductor layer SM from the gate electrode GE.

The gate electrode GE may be disposed on the first insulating layer 121 to overlap with the semiconductor layer SM.

In an exemplary embodiment, the gate electrode GE may include at least one of aluminum (Al), Al alloy, silver (Ag), tungsten (W), copper (Cu), nickel (Ni), chromium (Cr), molybdenum (Mo), titanium (Ti), platinum (Pt), tantalum (Ta), neodymium (Nd), scandium (Sc), and alloys thereof.

A second insulating layer 122 may be disposed over the gate electrode GE. The second insulating layer 122 insulates the gate electrode GE from the source and drain electrodes SE and DE.

The source electrode SE and the drain electrode DE may be disposed on the second insulating layer 122 to be spaced apart from each other at a predetermined distance. The source electrode SE may be connected to the source region of the semiconductor layer SM, and the drain electrode DE may be connected to the drain region of the semiconductor layer SM.

Although a thin film transistor implemented in a top gate structure is illustrated in FIG. 3, the inventive concepts are not limited thereto, and the thin film transistor TFT may be, for example, a thin film transistor having a bottom gate structure.

A third insulating layer 123 may be disposed over the source electrode SE and the drain electrode DE. The third insulating layer 123 may include a contact hole CH through which a portion of the drain electrode DE is exposed to the outside.

The third insulating layer 123 may be an organic protective layer. The organic protective layer may include at least one of acryl, polyimide, polyamide, and benxocyclobutene (BCB). The organic protective layer may be a planarization layer that has transparency and liquidity, and reduces or planarizes the bending of a lower structure.

The organic light emitting element OLED connected to the drain electrode DE may be disposed on the third insulating layer 123.

The organic light emitting element OLED may be of one of a bottom emission type, a top emission type, and a dual emission type. In an exemplary embodiment, the top emission type, in which the organic light emitting element OLED emits light in the direction of the touch sensing part 200, will be mainly described.

The organic light emitting element OLED includes a first electrode 125 that is a reflective electrode capable of reflecting light, an organic light emitting layer 126 disposed on the first electrode 125, and a second electrode 127 that is a transmissive electrode disposed on the organic light emitting layer 126, the transmissive electrode allowing light to be transmitted therethrough.

The first electrode 125 may be connected to the drain electrode DE. The first electrode 125 may serve as an anode electrode.

In an exemplary embodiment, the first electrode 125 may include at least one of molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), calcium (Ca), and alloys thereof.

A pixel defining layer 124 may be disposed over the first electrode 125. The pixel defining layer 124 includes an opening through which a portion of the first electrode 125 is exposed. The pixel defining layer 124 may include an organic insulating material. The organic light emitting layer 126 may be disposed on the first electrode 125 exposed by the pixel defining layer 124.

The second electrode 127 may be formed as a transmissive electrode. The second electrode 127 may serve as a cathode electrode.

In an exemplary embodiment, the second electrode 127 may be a semi-transmissive layer obtained by thinly forming a metal, such as lithium (Li), calcium (Ca), LiF/Ca, LiF/Al, aluminum (Al), magnesium (Mg), or silver (Ag), which has a low work function.

In another exemplary embodiment, the second electrode 127 may be a conductive layer including at least one transparent conductive oxide selected from indium tin oxide (ITO), indium zinc oxide (IZO), aluminum zinc oxide (AZO), gallium doped zinc oxide (GZO), zinc tin oxide (ZTO), gallium tin oxide (GTO), and fluorine doped tin oxide (FTO).

The first electrode 125 and the second electrode 127 may have opposite polarities. If a voltage is applied between the first electrode 125 and the second electrode 127, the organic light emitting layer 126 may emit light. In an exemplary embodiment, the organic light emitting layer 126 may emit blue light, green light, red light, or white light.

The thin film encapsulation layer 130 may protect the organic light emitting element OLED from external moisture and oxygen by encapsulating the organic light emitting element OLED.

In an exemplary embodiment, the thin film encapsulation layer 130 may have a structure in which at least one inorganic layer and at least one organic layer are alternately stacked.

The buffer layer 300 may be disposed on the thin film encapsulation layer 130. The buffer layer 300 may include the first organic layer 310 and the inorganic layer 320.

The first organic layer 310 may be a polymer organic compound. For example, the first organic layer 310 may include at least one of epoxy, acrylate, and urethane acrylate.

In an exemplary embodiment, the first organic layer 310 may include multiple layers or a multi-layered structure.

The inorganic layer 320 may be disposed on the first organic layer 310. The inorganic layer 320 may be made of metal oxide, metal nitride, metal carbide, or a combination thereof.

In an exemplary embodiment, the inorganic layer 320 may be configured in a single layer or a plurality of layers, including silicon nitride ($SiN_x$), silicon oxide ($SiO_2$), silicon oxynitride ($SiO_xN_y$), or aluminum oxide ($Al_2O_3$).

The touch sensing part 200 may be disposed on the inorganic layer 320. The touch sensing part 200 may include touch electrodes 210, a second organic layer 220, a black matrix 230, a color filter 240, an adhesive 250, and a window 260.

The touch electrodes 210 may be disposed on the inorganic layer 320 to be spaced apart from each other at a predetermined distance, thereby detecting a touch operation. The touch electrodes 210 may be made of a transparent conductive oxide.

In an exemplary embodiment, the touch electrodes 210 may include at least one of indium tin oxide (ITO), indium zinc oxide (IZO), zinc oxide (ZnO), indium oxide ($In_2O_3$), indium gallium oxide (IGO), and aluminum zinc oxide (AZO).

The second organic layer 220 may be disposed on the inorganic layer 320 to cover the touch electrodes 210. The second organic layer 220 may be formed as an organic insulating layer. In addition, the second organic layer 220 may be formed of a material capable of growing a layer using a low-temperature sputtering process. Here, a portion of the second organic layer 220 may be disposed to be in direct contact with the inorganic layer 320.

In the display device 10 according to an exemplary embodiment of the inventive concepts, the second organic layer 220 covering the touch electrodes 210 is in contact with the inorganic layer 320, so that it is possible to prevent separation between the touch sensing part 200 and the buffer layer 300 even when the display device 10 is curved or bent.

The black matrix 230 may be disposed on the second organic layer 220 to overlap with the touch electrodes 210. The color filter 240 may be disposed on the second organic layer 220 to overlap with the organic light emitting layer 126, so that a color can be provided to light transmitted through a pixel region.

In this case, the black matrix 230 divides the color filters 240 from each other, and can block unnecessary light when the display device 10 implements an image.

The adhesive layer 250 may be disposed over the black matrix 230 and the color filter 240.

The window 260 may be disposed on the adhesive layer 250. The window 260 can block oxygen, moisture, and the like, which are introduced from the outside, and protect the touch sensing part 200 from an external environment such as an external force.

Figure 4:
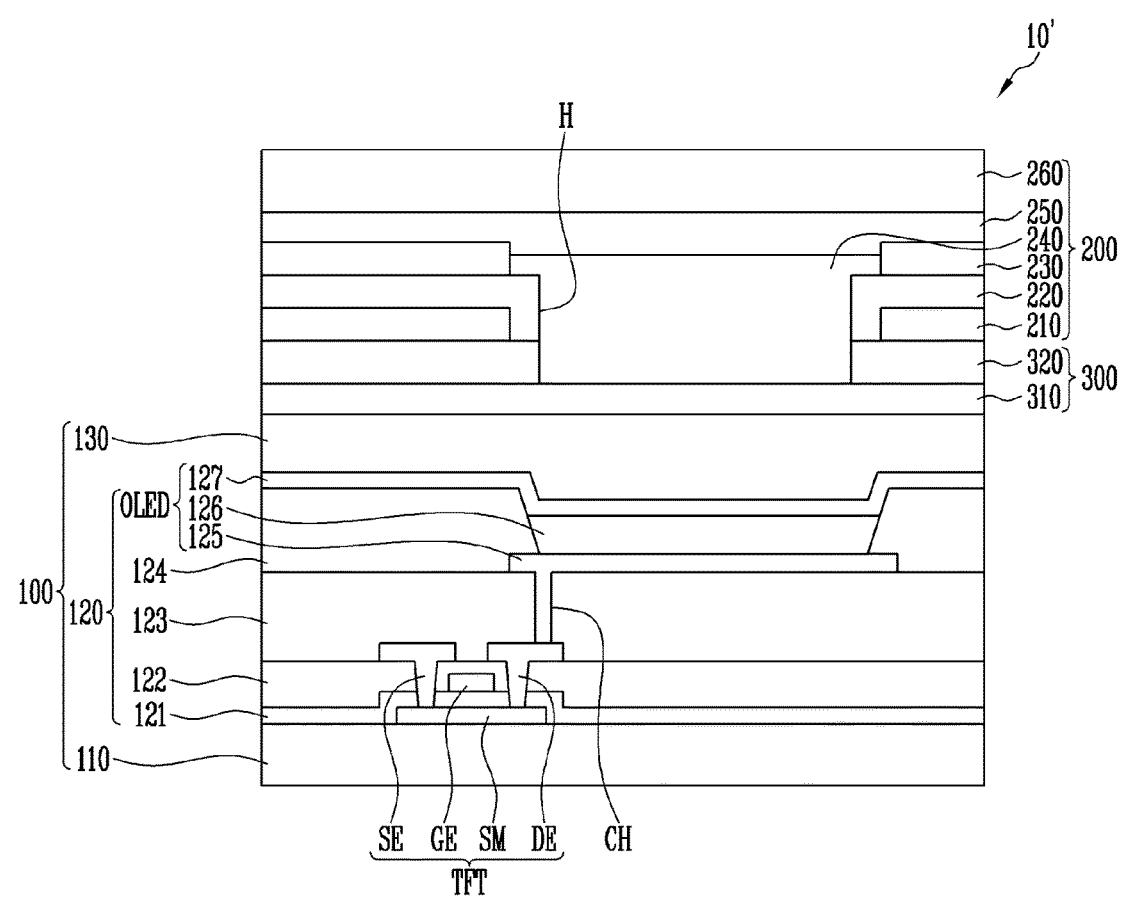
FIG. 4 is a sectional view illustrating a flexible display device according to another exemplary embodiment of the inventive concepts.

FIG. 4 is a sectional view illustrating a flexible display device according to another exemplary embodiment of the inventive concepts.

In the display device 10' shown in FIG. 4, differences from the display device 10 shown in FIG. 3 will be mainly described to avoid redundancy. Portions not particularly described in FIG. 4 follow those of the display device 10 according to the above-described exemplary embodiment. In addition, identical reference numerals refer to identical components, and similar reference numerals refer to similar components.

Referring to FIG. 4, the second organic layer 220 of the touch sensing part 200 and the inorganic layer 320 of the buffer layer 300 may include a through-hole H through which the first organic layer 310 is exposed.

The color filter 240 may be disposed on the first organic layer 310 through the through-hole H.

In the display device 10' according to this exemplary embodiment of the inventive concepts, the inorganic layer 320 and the second organic layer 220 are removed in a region in which the organic light emitting layer 126 and the color filter 240, so that it is possible to prevent light emitted from the organic light emitting layer 126 from being reflected or blocked by the inorganic layer 320 or the second organic layer 220.

Further, in the display device 10', the color filter 240 is disposed through the through-hole H formed in the second organic layer 220 and the inorganic layer 320, so that light emitted from the organic light emitting layer 126 can be effectively condensed.

In the display device according to the inventive concepts, the organic layer of the touch sensing part is in contact with the inorganic layer of the thin film encapsulation layer, so that it is possible to prevent separation between the touch sensing part and the thin film encapsulation layer when the display device is curved or bent.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display device comprising:
a base substrate;
a display element disposed on the base substrate;
a thin film encapsulation layer covering the display element;
a first organic layer disposed on the thin film encapsulation layer;
an inorganic layer disposed on the first organic layer;
touch electrodes disposed on the inorganic layer; and
a second organic layer disposed on the inorganic layer, the second organic layer covering the touch electrodes,
wherein the second organic layer is in contact with the inorganic layer.

2. The display device of claim 1, further comprising a color filter disposed on the second organic layer.

3. The display device of claim 2, wherein the color filter is disposed to overlap with an organic light emitting layer of the display element.

4. The display device of claim 1, further comprising a black matrix disposed on the second organic layer.

5. The display device of claim 1, wherein the base substrate has flexibility.

6. The display device of claim 1, wherein the display element comprises:
- a thin film transistor disposed on the base substrate;
- an insulating layer disposed on the thin film transistor, the insulating layer comprising a contact hole through which a portion of a drain electrode of the thin film transistor; and
- an organic light emitting element disposed on the insulating layer.

7. The display device of claim 6, wherein the thin film transistor comprises:
- a semiconductor layer disposed on the base substrate;
- a gate electrode disposed on the semiconductor layer; and
- source and drain electrodes each connected to the semiconductor layer.

8. The display device of claim 6, wherein the organic light emitting element comprises:
- a first electrode disposed on the insulating layer;
- a pixel defining layer disposed on the insulating layer, the pixel defining layer defining pixel regions;
- an organic light emitting layer disposed on the first electrode; and
- a second electrode disposed on the organic light emitting layer.

9. The display device of claim 1, wherein the first organic layer comprises multiple layers or a multi-layered structure.

10. A display device comprising:
- a base substrate;
- a display element disposed on the base substrate;
- a thin film encapsulation layer covering the display element;
- a first organic layer disposed on the thin film encapsulation layer;
- an inorganic layer disposed on the first organic layer;
- touch electrodes disposed on the inorganic layer; and
- a second organic layer disposed on the inorganic layer, the second organic layer covering the touch electrodes,
- wherein the second organic layer and the inorganic layer comprise a through-hole through which the first organic layer is exposed.

11. The display device of claim 10, wherein the color filter is disposed on the first organic layer through the through-hole.

12. A method of manufacturing a display device, the method comprising:
- forming a display element on a base substrate;
- forming a thin film encapsulation layer covering the display element;
- forming a first organic layer on the thin film encapsulation layer;
- forming an inorganic layer on the first organic layer; and
- forming a touch sensing part on the inorganic layer,
- wherein the forming of the touch sensing part comprises:
  - forming touch electrodes on the inorganic layer;
  - forming a second organic layer on the inorganic layer to cover the touch electrodes;
  - forming a through-hole through which the second organic layer and the inorganic layer expose the first organic layer; and
  - forming a color filter on the second organic layer.

* * * * *

UNITED STATES PATENT AND TRADEMARK OFFICE
CERTIFICATE OF CORRECTION

Page 1 of 1

PATENT NO. : 10,249,692 B2
APPLICATION NO. : 15/622029
DATED : April 2, 2019
INVENTOR(S) : Min Jung Lee, Do Hyun Kwon and Mi Jang It is certified that error appears in the above-identified patent and that said Letters Patent is hereby corrected as shown below:

On the Title Page

Please correct item (73) Assignee from "Seoul Viosys Co., Ltd., Ansan-si (KR)" to --Samsung Display Co., Ltd., Yongin-si (KR)--.

Signed and Sealed this
Ninth Day of July, 2019

Andrei Iancu
*Director of the United States Patent and Trademark Office*